(12) United States Patent
Kodera et al.

(10) Patent No.: US 10,489,088 B2
(45) Date of Patent: Nov. 26, 2019

(54) STORAGE DEVICE COMPATIBLE WITH SELECTED ONE OF MULTIPLE INTERFACE STANDARDS

(71) Applicant: Toshiba Memory Corporation, Tokyo (JP)

(72) Inventors: Shunsuke Kodera, Yokohama Kanagawa (JP); Yoshio Furuyama, Yokosuka Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 167 days.

(21) Appl. No.: 15/675,200

(22) Filed: Aug. 11, 2017

(65) Prior Publication Data

US 2018/0113652 A1 Apr. 26, 2018

(30) Foreign Application Priority Data

Oct. 24, 2016 (JP) .................. 2016-207843

(51) Int. Cl.
*G06F 3/06* (2006.01)
*G06F 12/02* (2006.01)
*H01L 27/02* (2006.01)

(52) U.S. Cl.
CPC .......... *G06F 3/0679* (2013.01); *G06F 3/0605* (2013.01); *G06F 3/0661* (2013.01); *G06F 3/0688* (2013.01); *G06F 12/0246* (2013.01); *H01L 27/02* (2013.01)

(58) Field of Classification Search
CPC .... G06F 3/0679; G06F 3/0659; G06F 3/0605; G06F 3/0611; G06F 3/0619; G06F 3/0655; G06F 3/0688; G06F 3/06; G06F 3/0661; G06F 12/0246; G06F 12/1433;
(Continued)

(56) References Cited

U.S. PATENT DOCUMENTS 7,259,702 B2 8/2007 Rai et al.
8,102,710 B2 1/2012 Pekny et al.
(Continued)

FOREIGN PATENT DOCUMENTS

JP H1139245 A 2/1999
JP 2001283170 A 10/2001
(Continued)

OTHER PUBLICATIONS

U.S. Appl. No. 15/446,910, filed Mar. 1, 2017.
Toshiba Datasheet TC58NVG0S3HTA00, Aug. 31, 2012, 51 pages.
Toshiba Datasheet TC58BVG0S3HTA00, Aug. 31, 2012, 44 pages.

*Primary Examiner* — Mano Padmanabhan
*Assistant Examiner* — Jean C Edouard
(74) *Attorney, Agent, or Firm* — Kim & Stewart LLP

(57) ABSTRACT

A storage device includes a nonvolatile semiconductor memory module, and a host interface for connection to a host that is external to the storage device. The host interface includes a first interface circuit conforming to Serial Peripheral Interface (SPI) and a second interface circuit conforming to an interface standard different from SPI. Output terminals of the first interface circuit are connected to input terminals of the second interface circuit, and output terminals of the second interface circuit are connected to input terminals of the nonvolatile semiconductor memory module.

18 Claims, 5 Drawing Sheets

(58) Field of Classification Search
CPC ...... G06F 11/10; G06F 11/1068; G06F 12/02; G06F 13/4234; H01L 27/20
USPC .......................................................... 711/103
See application file for complete search history.

(56) References Cited

U.S. PATENT DOCUMENTS

| | | | |
|---|---|---|---|
| 8,745,299 B2* | 6/2014 | Zer | ............ G06F 13/28 710/22 |
| 8,996,785 B2 | 3/2015 | Lee et al. | |
| 9,122,420 B2 | 9/2015 | Pekny et al. | |
| 9,235,546 B2 | 1/2016 | Pekny et al. | |
| 2004/0153582 A1* | 8/2004 | Oyama | ............ G06F 1/10 710/15 |
| 2004/0156242 A1* | 8/2004 | Iida | ............ G06K 19/07 365/185.28 |
| 2004/0193823 A1* | 9/2004 | Kelly | ............ G06F 5/06 711/168 |
| 2005/0211786 A1* | 9/2005 | Iida | ............ G06K 19/07 235/492 |
| 2007/0115743 A1 | 5/2007 | Sartori et al. | |
| 2008/0245878 A1* | 10/2008 | Shiota | ............ G06K 19/07 235/492 |
| 2009/0103362 A1* | 4/2009 | Pekny | ............ G06F 13/1694 365/185.04 |
| 2009/0125672 A1* | 5/2009 | Ito | ............ G06F 13/4234 711/103 |
| 2011/0051519 A1 | 3/2011 | Lee et al. | |
| 2013/0238846 A1* | 9/2013 | Pekny | ............ G06F 12/0246 711/103 |
| 2014/0063943 A1* | 3/2014 | Nagashima | ............ G11C 16/30 365/185.08 |
| 2014/0082260 A1* | 3/2014 | Oh | ............ G06F 13/1668 711/103 |
| 2015/0371688 A1 | 12/2015 | Pekny et al. | |

FOREIGN PATENT DOCUMENTS

| | | |
|---|---|---|
| JP | 4565966 B2 | 10/2010 |
| TW | 201120886 A | 6/2011 |

* cited by examiner

STORAGE DEVICE COMPATIBLE WITH SELECTED ONE OF MULTIPLE INTERFACE STANDARDS

CROSS-REFERENCE TO RELATED APPLICATION

This application is based upon and claims the benefit of priority from Japanese Patent Application No. 2016-207843, filed Oct. 24, 2016, the entire contents of which are incorporated herein by reference.

FIELD

Embodiments described herein relate generally to a storage device including a nonvolatile semiconductor memory module.

BACKGROUND

A storage device including a nonvolatile semiconductor memory module such as a NAND flash memory is widely known.

DETAILED DESCRIPTION

Figure 1:
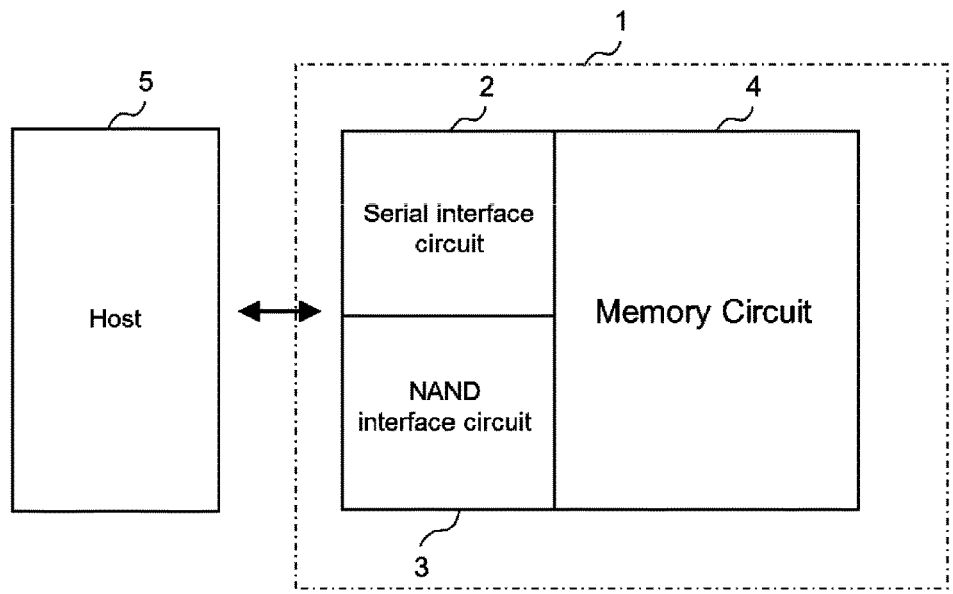
FIG. 1 illustrates a schematic configuration of a storage device according to a first embodiment.

An embodiment provides a storage device with a reduced circuit size.

In general, according to an embodiment, a storage device includes a nonvolatile semiconductor memory module, and a host interface for connection to a host that is external to the storage device. The host interface includes a first interface circuit conforming to Serial Peripheral Interface (SPI) and a second interface circuit conforming to an interface standard different from SPI. Output terminals of the first interface circuit are connected to input terminals of the second interface circuit, and output terminals of the second interface circuit are connected to input terminals of the nonvolatile semiconductor memory module.

Hereinafter, embodiments will be described with reference to the drawings. In the following embodiments, a semiconductor memory device is described as an example of a storage device. It is that, in the following description, elements having the same function or the same configuration will be identified with a common reference character.

1. First Embodiment

A semiconductor memory device according to a first embodiment will be described.

1.1 Configuration of Semiconductor Memory Device

First, a configuration of the semiconductor memory device according to the present embodiment will be described with reference to FIGS. 1 and 2. FIG. 1 is a schematic configuration diagram of the semiconductor memory device according to the present embodiment.

Figure 2:
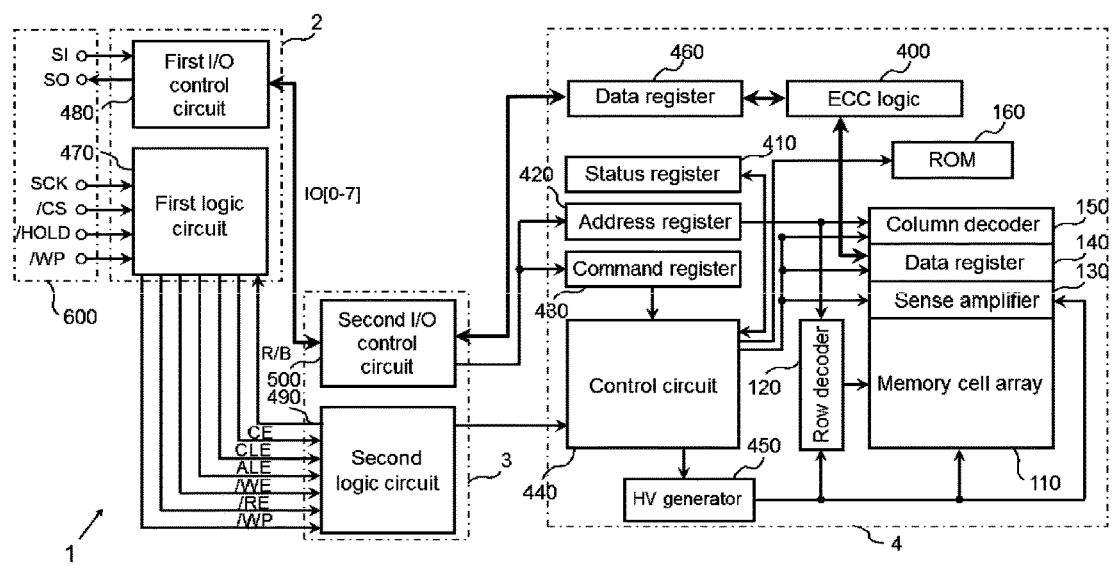
FIG. 2 illustrates a detail configuration of the storage device according to the first embodiment.

As depicted in FIGS. 1 and 2, a semiconductor memory device 1 includes a serial interface circuit 2, a NAND interface circuit 3, and a memory circuit 4. The serial interface circuit 2, the NAND interface circuit 3, and the memory circuit 4 are provided on a same semiconductor substrate.

The serial interface circuit 2 conforms to Serial Peripheral Interface (SPI). The serial interface circuit 2 communicates with a host apparatus 5 in accordance with a protocol set as SPI. The NAND interface circuit 3 conforms to an interface of a NAND flash memory (hereinafter referred to as a NAND interface). The memory circuit 4 includes a memory cell array including a plurality of memory cells.

FIG. 2 is a detail configuration diagram of the semiconductor memory device according to the present embodiment. The memory circuit 4 includes a memory cell array 110, a row decoder 120, a sense amplifier 130, a data register 140, a column decoder 150, ROM 160, an ECC circuit 400, a status register 410, an address register 420, a command register 430, a control circuit 440, a voltage generating circuit 450, and a data register 460.

The memory cell array 110 includes a plurality of nonvolatile memory cells which are correlated with rows and columns. In addition, the memory cells in the same row are connected to the same word line and the memory cells in the same column are connected to the same bit line. Reading and writing of data are collectively performed on the plurality of memory cells connected to the same word line. This unit is called a page. Data of one page include net data and management data. The net data are managed in a unit called a sector. For example, in this example, one page includes four sectors and each sector has a data size of 512 bytes. The management data include ECC data (parity) for error correction, for example. The error correction is performed for each sector. Therefore, the management data include ECC data prepared for each sector. The memory cell array 110 includes a plurality of NAND strings. Each NAND string is configured so that a plurality of memory cells in the same column is connected in series. One end of the NAND string is connected to a corresponding bit line via a select transistor. Moreover, erasing of data is collectively performed on a plurality of pages. These pages are called a block. The memory cell may be a single level cell (SLC) that stores 1-bit information per memory cell or may be a multilevel cell (MLC) that stores multi-bit information per memory cell.

The row decoder 120 decodes a row address designating a row direction of the memory cell array 110. Then, the row decoder 120 selects a word line in accordance with the decoding result and applies a voltage necessary for writing, reading, and erasing of data.

At the time of reading data, the sense amplifier 130 senses data read from the memory cell array 110 and transfers the data to the data register 140. At the time of writing data, the sense amplifier 130 transfers the data in the data register 140 to the memory cell array 110.

The data register 140 temporarily holds one page of write data or read data.

The column decoder 150 decodes a column address designating a column direction of the memory cell array 110. Then, in accordance with the decoding result, the column decoder 150 transfers data to the data register 140 at the time of writing and reads data from the data register 140 at the time of reading.

The ROM 160 stores various kinds of setting data.

The ECC circuit 400 performs error detection and error correction processing. More specifically, at the time of writing data, the ECC circuit 400 generates parity for each sector based on data received from the host apparatus 5. Then, the control circuit 440 transfers this parity and the net data to the data register 140. At the time of reading data, the ECC circuit 400 generates syndrome for each sector based on the parity included in data transferred from the data register 140 and detects presence or absence of an error. Then, if detecting an error, the ECC circuit 400 identifies the bit position thereof and corrects the error. The number of error bits which can be corrected per sector is, for example, 8 bits per sector in this example. Moreover, the ECC circuit 400 can output the number of error bits detected in each sector to the status register 410 as status information.

The serial interface circuit 2 includes a first logic circuit 470 and a first input/output control circuit 480.

The first logic circuit 470 receives a serial clock signal SCK, a chip select signal /CS, a control signal /HOLD, and a control signal /WP from the host apparatus 5. The chip select signal /CS is a signal for activating the semiconductor memory device 1 (in other words, a signal that is activated when access to the semiconductor memory device 1 is made) and is asserted ("L" level) when the host apparatus 5 inputs a command to the semiconductor memory device 1. The control signal /HOLD is asserted ("L" level) when, for example, communication between the host apparatus 5 and the semiconductor memory device 1 is temporarily stopped. The control signal /WP is a write protect signal and is asserted ("L" level) when an update of a specific bit in a characteristics table storing information and setting data of the semiconductor memory device 1 is disabled.

The first input/output control circuit 480 receives serial data SI from the host apparatus 5. If the serial data SI are a command, the first input/output control circuit 480 converts the command into a command on the NAND interface and outputs the converted command to a second input/output control circuit 500. It is noted that, in this command conversion, the relationship between the number of commands on SPI and the number of corresponding commands on the NAND interface may be one of one-to-one relationship, one-to-multiple relationship, multiple-to-one relationship, and multiple-to-multiple relationship. That is, the first input/output control circuit 480 may convert one command on SPI into one or more commands on the NAND interface corresponding to the one command on SPI or may convert a plurality of commands on SPI into one or more commands on the NAND interface corresponding to the plurality of commands on SPI.

Moreover, if the serial data SI are an address, the first input/output control circuit 480 outputs the address to the second input/output control circuit 500 as an address on the NAND interface. Furthermore, if the serial data SI are data, the first input/output control circuit 480 outputs the data to the second input/output control circuit 500 as data on the NAND interface. Moreover, the first input/output control circuit 480 sends serial data SO to the host apparatus 5.

The NAND interface circuit 3 includes a second logic circuit 490 and the second input/output control circuit 500.

The first logic circuit 470 sends a chip enable signal /CE, a command latch enable signal CLE, an address latch enable signal ALE, a write enable signal /WE, a read enable signal /RE, and a write protect signal /WP to the second logic circuit 490.

The second logic circuit 490 receives the signals /CE, CLE, ALE, /WE, /RE, and /WP from the first logic circuit 470. The signal /CE is a signal for activating the memory circuit 4 by being asserted at a low level. The signals CLE and ALE are signals which inform the second input/output control circuit 500 that input signals I/O to the second input/output control circuit 500 are a command and an address, respectively. The signal /WE is a signal for making the second input/output control circuit 500 take in an input signal I/O by being asserted at a low level. The signal /RE is a signal for reading an output signal I/O from the second input/output control circuit 500 to the first input/output control circuit 480 also by being asserted at a low level.

Moreover, the second logic circuit 490 sends a ready/busy signal R/B to the first logic circuit 470. The signal R/B is a signal indicating whether the memory circuit 4 is in a ready state (a state in which the memory circuit 4 can receive an instruction from the host apparatus 5) or a busy state (a state in which the memory circuit 4 cannot receive an instruction from the host apparatus 5), and a low level indicates a busy state.

When the first logic circuit 470 outputs a command to the second logic circuit 490, the first logic circuit 470 asserts the signal CLE and informs the NAND interface circuit 3 that the input signal I/O to the second input/output control circuit 500 is a command. Moreover, when the first logic circuit 470 outputs an address to the second logic circuit 490, the first logic circuit 470 asserts the signal ALE and informs the NAND interface circuit 3 that the input signal I/O to the second input/output control circuit 500 is an address.

The second input/output control circuit 500 receives a signal IO[0-7]. Then, if the signal IO is an address (if ALE="H"), the second input/output control circuit 500 causes the address register 420 to hold the address. Moreover, if the signal IO is a command (if CLE="H"), the second input/output control circuit 500 causes the command register 430 to hold the command. Furthermore, if the signal IO is data (if ALE=CLE="L"), the second input/output control circuit 500 causes the data register 460 to hold the data.

The signals SCK, /CS, /HOLD, and /WP are transferred between the first logic circuit 470 and the host apparatus 5, and the signals SI and SO are transferred between the first input/output control circuit 480 and the host apparatus 5 via individually independent first terminals 600. The first terminals 600 are provided on the same semiconductor substrate as the serial interface circuit 2, the NAND interface circuit 3, and the memory circuit 4. On the other hand, for the signals /CE, CLE, ALE, /WE, /RE, /WP, and IO, terminals for communicating with the host apparatus 5 are not provided.

The status register 410 holds various kinds of status information of the semiconductor memory device 1. Examples of the status information include the above-described number of error bits provided from the ECC circuit 400 and information, which is provided from the control circuit 440, indicating whether write operation and erasing operation have been successfully performed (passed) or unsuccessfully performed (failed).

The control circuit 440 controls the whole of the semiconductor memory device 1 based on the command held in the command register 430 and various signals input to the second logic circuit 490.

The voltage generating circuit 450 generates a voltage necessary for data write, read, and erasing operations based on the instruction of the control circuit 440 and supplies the voltage to the memory cell array 110, the row decoder 120, and the sense amplifier 130.

1.2 Data Write Operation

Next, a data write operation carried out in the semiconductor memory device 1 according to the present embodiment will be described below.

Figure 3:
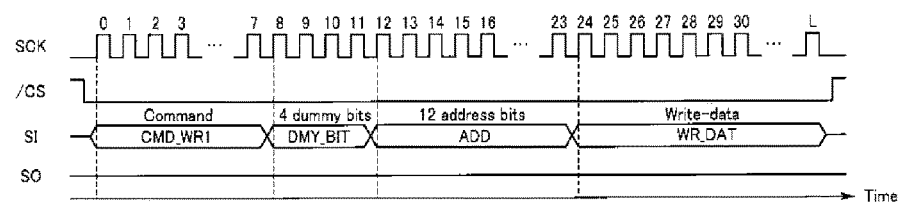
FIGS. 3 and 4 are each a timing chart of various signals in accordance with the SPI that are processed in the storage device according to the first embodiment at the time of writing of data.

FIG. 3 is a timing chart of various signals on the SPI bus between the host apparatus 5 and the serial interface circuit 2. As depicted in FIG. 3, the host apparatus 5 asserts the signal /CS, issues a first write command CMD_WR1 as a signal SI, and inputs the clock SCK. The serial interface circuit 2 recognizes that a portion of the signal SI received from the host apparatus 5 right after the signal /CS is asserted is a command. Specifically, the serial interface circuit 2 recognizes that an initial portion of the signal SI received in synchronization with the clock SCK after the signal /CS is asserted is a command. This command is an 8-bit signal which is input in 8 clock cycles, for example.

The host apparatus 5 subsequently sends a dummy bit DMY_BIT to the serial interface circuit 2 in 4 clock cycles, for example, and then sends an address ADD to the serial interface circuit 2 in 12 clock cycles, for example. This address ADD is an address that designates a column in a page in the memory cell array 110. Furthermore, the host apparatus 5 sends write data WR_DAT to the serial interface circuit 2. Then, after sending the write data WR_DAT, the host apparatus 5 deasserts the signal /CS.

As described above, what type of signal is input after a particular command is received (a command sequence) is determined in advance. By registering this command sequence determined in advance, the serial interface circuit 2 determines the type of the signal SI that is input in a certain clock cycle after the reception of the command. That is, the serial interface circuit 2 understands that, if the serial interface circuit 2 receives, for example, a first write command, the signal SI that is input in the following 4 clock cycles is meaningless dummy data and the signal SI that is input in the following 12 clock cycles is a substantial address signal.

Figure 4:
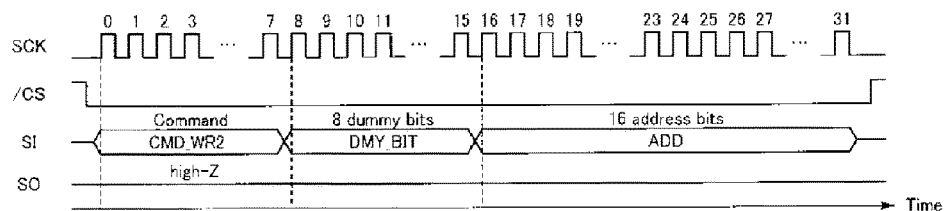

Next, FIG. 4 will be explained. As is the case with FIG. 3, FIG. 4 is a timing chart of various signals on the SPI bus and depicts signals that are sent and received after sending and reception of the signals depicted in FIG. 3. After sending a second write command CMD_WR2, the host apparatus 5 sends an 8-bit dummy bit DMY_BIT in 8 clock cycles, for example, and then sends a 16-bit address ADD to the serial interface circuit 2 in 16 clock cycles, for example. This address ADD is an address that designates a block and a page in the memory cell array 110. After sending the address ADD, the host apparatus 5 deasserts the signal /CS.

The first input/output control circuit 480 converts the first write command CMD_WR1 and the second write command CMD_WR2 into a write command "80h" and a write command "10h", respectively, which comply with the NAND interface. Then, the first input/output control circuit 480 sends the commands "80h" and "10h" to the second input/output control circuit 500. Moreover, the first input/output control circuit 480 sends the address received via the SPI bus, which indicates a block, a page, and a column, to the second input/output control circuit 500 as an address on the NAND interface indicating the same block, page, and column. Furthermore, the first input/output control circuit 480 sends the data WR_DAT received via the SPI bus to the second input/output control circuit 500 as data on the NAND interface.

Next, signals that are sent and received over the NAND bus between the serial interface circuit 2 and the NAND interface circuit 3 will be described below.

Figure 5:
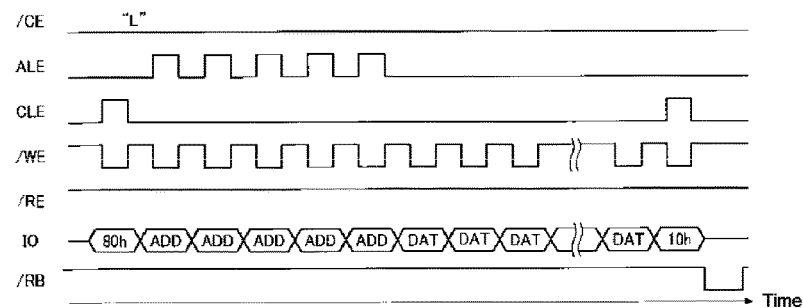
FIG. 5 is a timing chart of various signals in accordance with a NAND interface that are processed in the storage device according to the first embodiment at the time of writing of data.

FIG. 5 is a timing chart of various signals on the NAND bus. The serial interface circuit 2 issues a write command "80h" and sends the write command "80h" to the NAND interface circuit 3. The serial interface circuit 2 subsequently sends an address ADD to the NAND interface circuit 3 in 5 clock cycles, for example, and write data DAT are further sent to the NAND interface circuit 3 in multiple clock cycles. The serial interface circuit 2 then issues a write command "10h" and sends the write command "10h" to the NAND interface circuit 3. It is noted that this address ADD contains the address indicating the block, the page, and the column, the address received by the serial interface circuit 2 in the operations depicted in FIGS. 3 and 4.

In response to the command "10h", in the semiconductor memory device 1, an operation to write data into the memory cell array 110 is started, and the semiconductor memory device 1 enters a busy state (/R/B="L"). When writing of data into the memory cell array 110 is completed, the semiconductor memory device 1 enters a ready state.

1.3 Advantage of First Embodiment

As depicted in FIGS. 1 to 5, the serial interface circuit 2 converts a signal conforming to SPI into a signal conforming to the NAND interface. As a result, for the NAND interface circuit 3 and the memory circuit 4, a configuration which is substantially similar to the existing NAND flash memory can be adopted. Thus, if the NAND flash memory has been already designed, by newly designing only the serial interface circuit 2 and portions related thereto, a new semiconductor memory device that complies with SPI can be developed using the existing semiconductor memory device.

2. Second Embodiment

A semiconductor memory device according to a second embodiment will be described. In the first embodiment, only signals on SPI can be supplied from the outside of the semiconductor memory device 1. That is, in the first embodiment, SPI is the only interface of the semiconductor memory device 1 between the semiconductor memory device 1 and the host apparatus 5. The second embodiment is configured such that not only signals on SPI, but also signals on the NAND interface can be supplied from the outside of the semiconductor memory device. As a result, one of SPI and the NAND interface can be selected as an interface between the semiconductor memory device and the host apparatus 5.

2.1 Configuration of Semiconductor Memory Device

Figure 6:
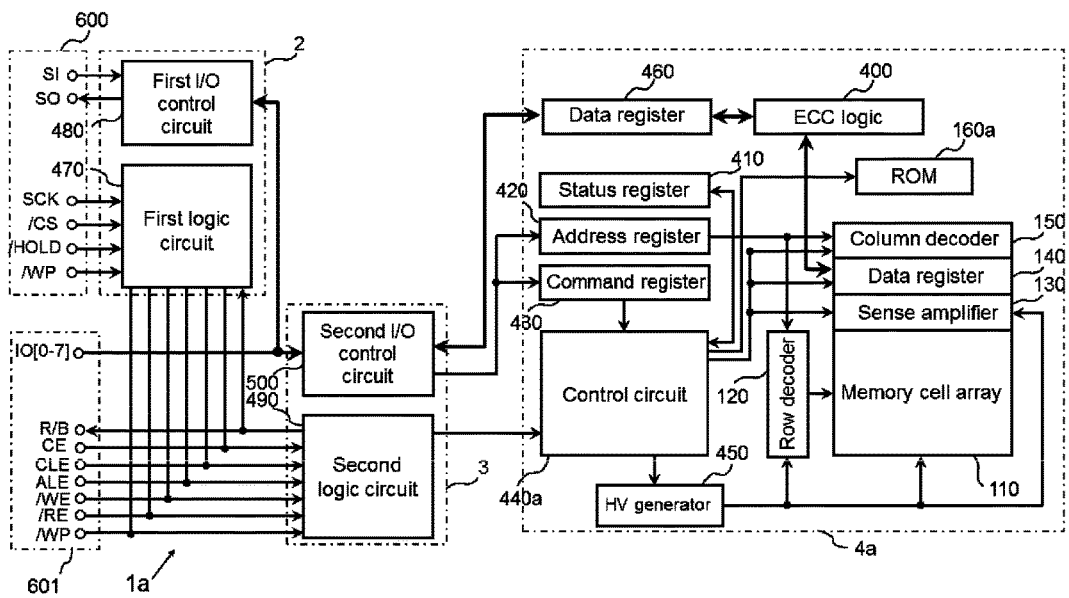
FIG. 6 illustrates a configuration of a storage device according to a second embodiment.

A configuration of the semiconductor memory device according to the present embodiment will be described with reference to FIG. 6. FIG. 6 is a detail configuration diagram of the semiconductor memory device according to the present embodiment. Here, descriptions will be given by focusing on portions which are different from the portions of the configuration of the first embodiment depicted in FIG. 2.

As compared to the semiconductor memory device 1 according to the first embodiment, in a semiconductor memory device 1a according to the present embodiment, also for the signals /CE, CLE, ALE, /WE, /RE, /WP, R/B, and IO, second terminals 601 for supplying these signals from the outside of the semiconductor memory device 1a are provided. If SPI is selected, the serial interface circuit 2 communicates with the host apparatus 5 via first terminals 600, and the NAND interface circuit 3 does not communicate directly with the host apparatus 5 and controls a memory circuit 4a based on a signal received from the serial interface circuit 2. On the other hand, if the NAND interface is selected, the NAND interface circuit 3 communicates with the host apparatus 5 via the second terminals 601 and the serial interface circuit 2 does not communicate with the host apparatus 5. For example, when the host apparatus 5 sends a write instruction to the semiconductor memory device 1a, the write instruction which the host apparatus 5 sends corresponds to the selected interface of SPI and the NAND interface. That is, the host apparatus 5 communicates with the semiconductor memory device 1a in accordance with a protocol that conforms to the selected interface while recognizing which of SPI and the NAND interface is selected.

The memory circuit 4a includes ROM 160a and a control circuit 440a. The ROM 160a stores setting data for deactivating the serial interface circuit 2 if the NAND interface is selected. The control circuit 440a deactivates the serial interface circuit 2 in accordance with this setting data if the NAND interface is selected.

As described below, only one of the serial interface circuit 2 and the NAND interface circuit 3 is connected to external connecting terminals of the semiconductor memory device 1a. A determination as to which of the serial interface circuit 2 or the NAND interface circuit 3 is selected, is made based on selective wire bonding which is performed on these external connecting terminals and the setting data stored in the ROM 160a.

2.2 Package of Semiconductor Memory Device

Figure 7:
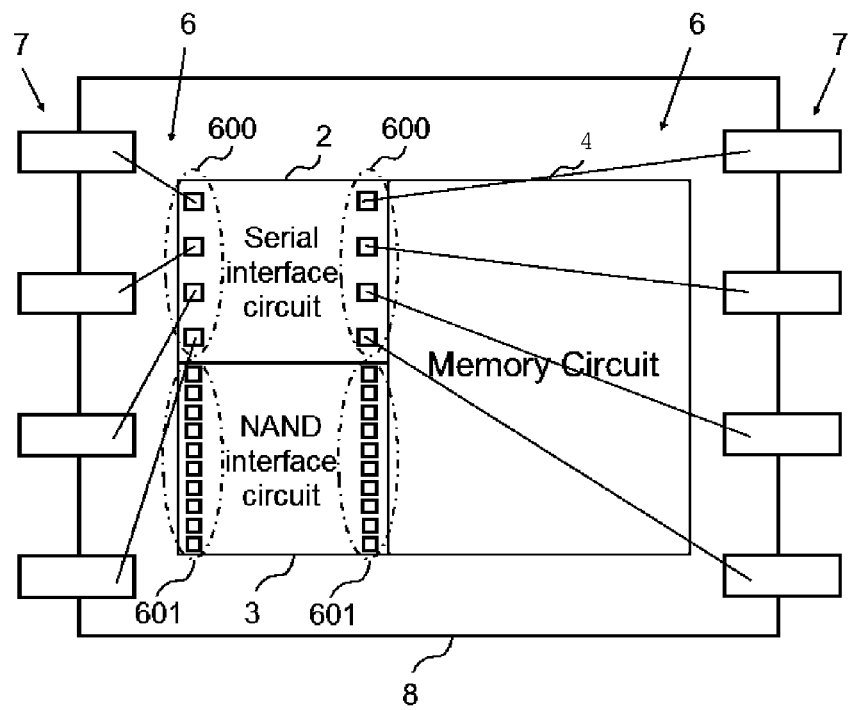
FIG. 7 illustrates a configuration of a package of the semiconductor memory device according to the second embodiment.

FIG. 7 depicts a package of the semiconductor memory device 1a according to the second embodiment. FIG. 7 depicts a case where the serial interface circuit 2 is selected.

Each of the first terminals 600 of the serial interface circuit 2 for the signals SCK, /CS, /HOLD, /WP, SI, and SO is connected to one end of a corresponding external connecting terminal 7 via a connecting wire 6. On the other hand, the second terminals 601 of the NAND interface circuit 3 for the signals /CE, CLE, ALE, /WE, /RE, /WP, R/B, and IO are not connected to the external connecting terminals 7.

The serial interface circuit 2, the NAND interface circuit 3, the memory circuit 4, and the connecting wires 6 are covered with a resin 8, for example. The other end of each of the external connecting terminals 7 is exposed. Various signals are input to the other ends of the external connecting terminals 7 from the host apparatus 5.

FIG. 7 depicts the case where the serial interface circuit 2 is selected. If the NAND interface circuit 3 is selected, each of the second terminals 601 of the NAND interface circuit 3 for the signals /CE, CLE, ALE, /WE, /RE, /WP, R/B, and IO is connected to one end of the corresponding external connecting terminal 7 via the connecting wire 6, and the first terminals 600 of the serial interface circuit 2 for the signals SCK, /CS, /HOLD, /WP, SI, and SO are not connected to the external connecting terminals 7.

As described above, by connecting the terminals of only one of the serial interface circuit 2 and the NAND interface circuit 3 to the external connecting terminals 7, one of the serial interface circuit 2 and the NAND interface circuit 3 is selected as a circuit to which the signals are input from the host apparatus 5.

2.3 Method for Producing Semiconductor Memory Device

Figure 8:
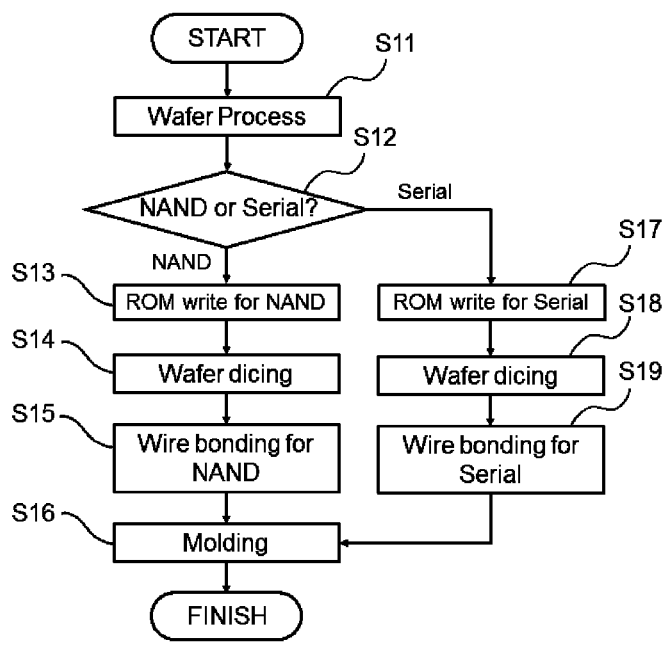
FIG. 8 is a flowchart of a method for producing the storage device according to the second embodiment.

Next, a method for producing the semiconductor memory device 1a according to the second embodiment will be described. FIG. 8 is a flowchart of the method for producing the semiconductor memory device 1a according to the second embodiment.

First, by a semiconductor process, the serial interface circuit 2, the NAND interface circuit 3, and the memory circuit 4a are formed on a semiconductor wafer (Step S11).

Next, it is determined as to whether SPI or the NAND interface is adopted as the interface of the semiconductor memory device 1a (Step S12). If it is determined that the NAND interface is adopted as the interface of the semiconductor memory device 1a, the setting data for deactivating the serial interface circuit 2 is written into the ROM 160a (Step S13). Next, the semiconductor wafer is diced, whereby the semiconductor wafer is divided into individual semiconductor chips (Step S14). Then, the individual semiconductor chips are mounted on supporting members such as lead frames, and the second terminals 601 of the NAND interface circuit 3 are connected to the external connecting terminals 7 via the connecting wires 6 by wire bonding (Step S15). Finally, the semiconductor chips are sealed in the resin 8, whereby the semiconductor memory device 1a depicted in FIG. 7 is produced (Step S16).

On the other hand, if it is determined in Step S12 that SPI is adopted as the interface of the semiconductor memory device 1a, the setting data for activating the serial interface circuit 2 are written into the ROM 160a (Step S17). Next, the semiconductor wafer is diced, whereby the semiconductor wafer is divided into individual semiconductor chips (Step S18). Step S18 is similar to Step S14. Then, the individual semiconductor chips are mounted on supporting members such as lead frames, and the first terminals 600 of the serial interface circuit 2 are connected to the external connecting terminals 7 via the connecting wires 6 by wire bonding (Step S19). Then, the procedure proceeds to Step S16, and the semiconductor chips are sealed in the resin.

2.4 Advantage of Second Embodiment

If a semiconductor memory device conforming to SPI and a semiconductor memory device 1a conforming to the NAND interface are separately produced, SPI cannot be changed to the NAND interface and vice versa. In this regard, the semiconductor memory device 1a according to the present embodiment can arbitrarily select one of SPI and the NAND interface. Moreover, since the semiconductor memory device 1a according to the present embodiment selects one of SPI and the NAND interface in a packaging process which is performed late in the semiconductor chip production process, time required before shipment of a product after selection of the interface is shorter. Thus, the semiconductor memory device 1a according to the present embodiment can provide a semiconductor memory device conforming to an interface matching market needs.

Moreover, if a serial interface circuit and a NAND interface circuit are separately configured in order to select one of SPI and the NAND interface arbitrarily, the circuit size increases. On the other hand, the semiconductor memory device 1a according to the present embodiment uses the NAND interface circuit 3 for control of the semiconductor memory device 1a even when SPI is selected as a result of the serial interface circuit 2 converting a signal complying with SPI into a signal complying with the NAND interface. For example, storage of a command in the command register 430 is performed by the NAND interface circuit 3 and not performed by the serial interface circuit 2. As described above, a common function of the serial interface circuit 2 and the NAND interface circuit 3 is implemented only in the NAND interface circuit 3, and the function of the NAND interface circuit 3 is used even when SPI is selected, whereby a situation in which the common function is implemented in both the serial interface circuit 2 and the NAND interface circuit 3 can be avoided. As a result, as compared to a case where the serial interface circuit and the NAND interface circuit are separately configured, the semiconductor memory device 1a according to the present embodiment can prevent increase in the circuit size.

3. Third Embodiment

A semiconductor memory device according to a third embodiment will be described. In the second embodiment, one of SPI and the NAND interface is selected by wire bonding which is performed on the external connecting terminals. In the third embodiment, one of SPI and the NAND interface can be selected by a command.

3.1 Configuration of Semiconductor Memory Device

Figure 9:
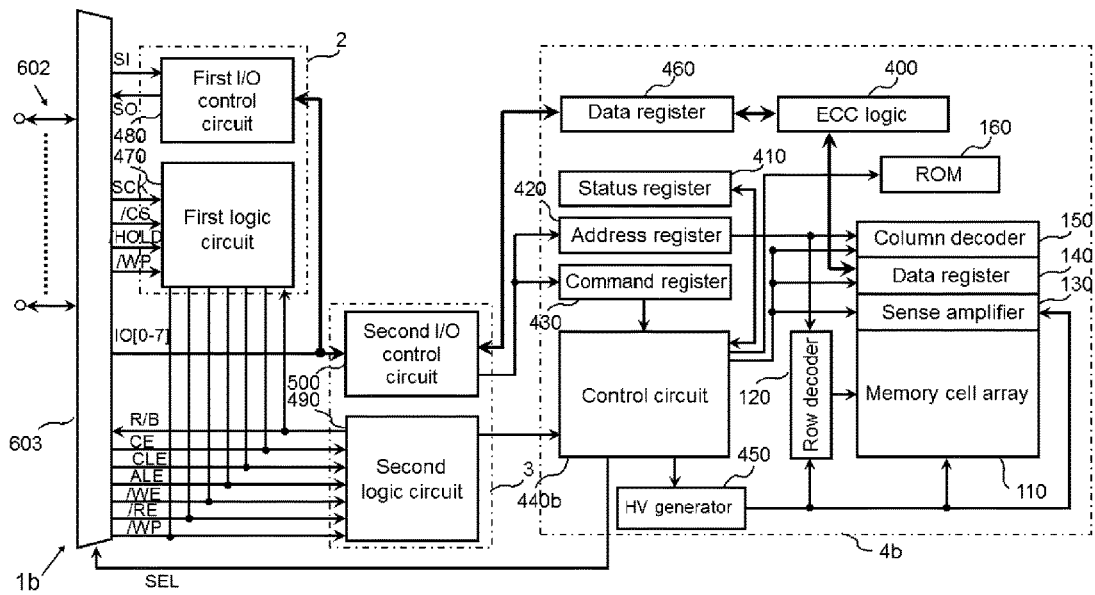
FIG. 9 illustrates a configuration of a storage device according to a third embodiment.

FIG. 9 is a detail configuration diagram of the semiconductor memory device according to the present embodiment. Here, descriptions will be given by focusing on portions which are different from the portions of the configuration of the first embodiment depicted in FIG. 2.

One of the serial interface circuit 2 and the NAND interface circuit 3 is selected as the initial setting when the power to a semiconductor memory device 1b is turned on. The NAND interface circuit 3 receives, from the host apparatus 5, a command SW for switching from the selected one interface to the non-selected other interface and stores the command SW in the command register 430. A memory circuit 4b includes a control circuit 440b. Based on the command SW stored in the command register 430, the control circuit 440b deactivates the serial interface circuit 2 if SPI is selected.

The semiconductor memory device 1b has a plurality of third terminals 602. The third terminals 602 are provided on the same semiconductor substrate as the serial interface circuit 2, the NAND interface circuit 3, and the memory circuit 4b. When SPI is selected as the interface of the semiconductor memory device 1b, the signals SCK, /CS, /HOLD, /WP, SI, and SO on SPI are supplied to the third terminals 602 from the host apparatus 5. On the other hand, when the NAND interface is selected as the interface of the semiconductor memory device 1b, the signals /CE, CLE, ALE, /WE, /RE, /WP, and IO on the NAND interface are supplied to the third terminals 602 from the host apparatus 5.

The semiconductor memory device 1b has a multiplexer 603. To an input terminal of the multiplexer 603, a plurality of signal lines (hereinafter referred to as an input signal line group) to which the signals are input from the host apparatus 5 via the third terminals 602 is connected. To an output terminal of the multiplexer 603, a plurality of signal lines (hereinafter referred to as a first output signal line group) that transfer the signals SCK, /CS, /HOLD, /WP, SI, and SO on SPI to the first logic circuit 470 and the first input/output control circuit 480 is connected. Moreover, to the output of the multiplexer 603, a plurality of signal lines (hereinafter referred to as a second output signal line group) that transfer the signals /CE, CLE, ALE, /WE, /RE, /WP, and IO on the NAND interface to the second logic circuit 490 and the second input/output control circuit 500 are connected. In response to the command SW, the control circuit 440b outputs a selection signal SEL to the multiplexer 603. The multiplexer 603 switches a connection destination of the input signal line group between the first output signal line group and the second output signal line group based on the selection signal SEL. Specifically, when SPI is selected, the multiplexer 603 connects at least part of the input signal line group to the first output signal line group. At this time, for example, the signal /CS supplied to the multiplexer 603 from the host apparatus 5 is output to the first logic circuit 470 as the signal /CS via the corresponding signal line of the first output signal line group. Moreover, when the NAND interface is selected, the multiplexer 603 connects at least part of the input signal line group to the second output signal line group. At this time, for example, the signal /CE supplied to the multiplexer 603 from the host apparatus 5 is output to the second logic circuit 490 as the signal /CE via the corresponding signal line of the second output signal line group.

Furthermore, in at least some of the third terminals 602, the terminals to which the signals on SPI are input and the terminals to which the signals on the NAND interface are input are the same. In other words, at least some of the third terminals 602, which receive the signals on SPI which will be received by the first logic circuit 470 and the first input/output control circuit 480 via the multiplexer 603 and at least some of the third terminals 602 which receive the signals on the NAND interface which will be received by the second logic circuit 490 and the second input/output control circuit 500 via the multiplexer 603 are the same.

3.2 Package of Semiconductor Memory Device

Figure 10:
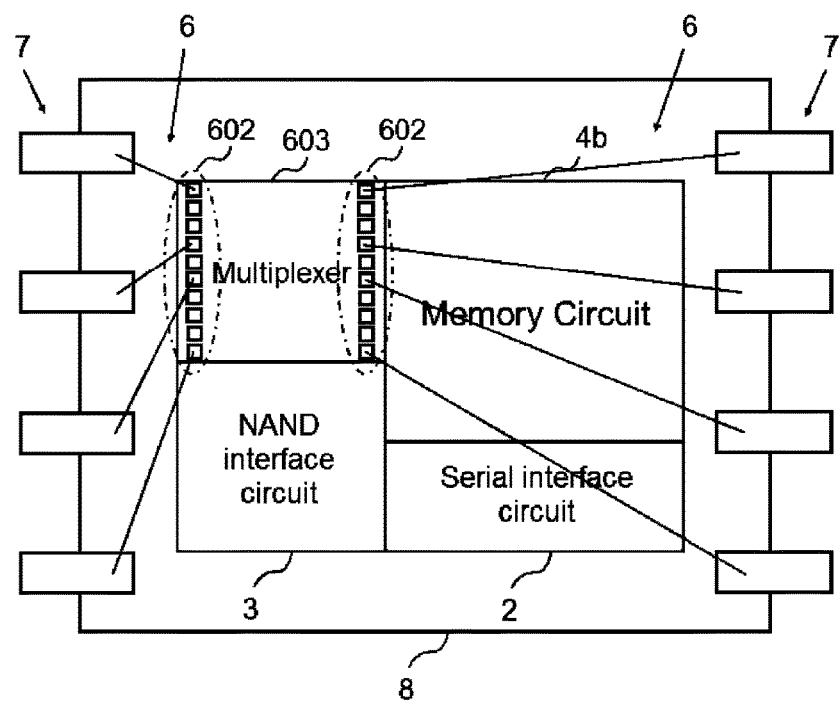
FIG. 10 illustrates a configuration of a package of the storage device according to the third embodiment.

FIG. 10 depicts a package of the semiconductor memory device 1b according to the third embodiment. FIG. 10 depicts a case where the serial interface circuit 2 is selected.

Of the third terminals 602, each of the terminals which receive the signals SCK, /CS, /HOLD, /WP, SI, and SO on SPI is connected to one end of the corresponding external connecting terminal 7 via the connecting wire 6.

The multiplexer 603, the serial interface circuit 2, the NAND interface circuit 3, the memory circuit 4b, and the connecting wires 6 are covered with the resin 8, for example. The other end of each external connecting terminal 7 is exposed. Various signals are input to the other ends of the external connecting terminals 7 from the host apparatus 5.

FIG. 10 depicts the case where the serial interface circuit 2 is selected. If the NAND interface circuit 3 is selected, of the third terminals 602, each of the terminals which receive the signals /CE, CLE, ALE, /WE, /RE, /WP, R/B, and IO on the NAND interface is connected to one end of the corresponding external connecting terminal 7 via the connecting wire 6.

3.3 Method for Producing Semiconductor Memory Device

Figure 11:
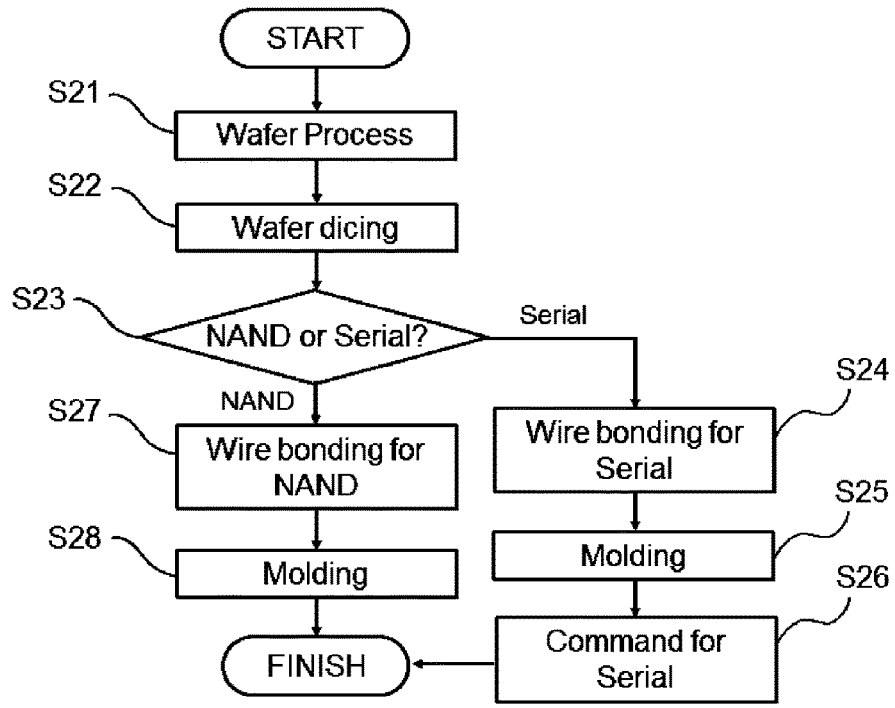
FIG. 11 is a flowchart of a method for producing the storage device according to the third embodiment.

Next, a method for producing the semiconductor memory device 1b according to the third embodiment will be described. FIG. 11 is a flowchart of the method for producing the semiconductor memory device 1b according to the third embodiment. A case where the initial setting of the interface of the semiconductor memory device 1b at power-on is the NAND interface will be described with reference to FIG. 11.

First, by a semiconductor process, the multiplexer 603, the serial interface circuit 2, the NAND interface circuit 3, and the memory circuit 4b are formed on a semiconductor wafer (Step S21). Next, the semiconductor wafer is diced, whereby the semiconductor wafer is divided into individual semiconductor chips (Step S22). Then, the individual semiconductor chips are mounted on supporting members such as lead frames, and it is determined as to whether the interface of the semiconductor memory device 1b is set to SPI or the NAND interface (Step S23). If it is determined that the interface of the semiconductor memory device 1b is set to SPI, the terminals of the third terminals 602 on the semiconductor chip which are used for transfer of the signals on SPI and the external connecting terminals 7 are connected by wire bonding (Step S24). Next, the semiconductor chips are sealed in the resin 8 (Step S25). Next, the host apparatus 5 issues, to the semiconductor memory device 1b, the command SW that switches the interface of the semiconductor memory device 1b to SPI (Step S26). In response to the command SW, the semiconductor memory device 1b switches the interface to SPI.

On the other hand, if it is determined in Step S23 that the interface of the semiconductor memory device 1b is set to the NAND interface, the terminals of the third terminals 602 on the semiconductor chip which are used for transfer of the signals on the NAND interface, and the external connecting terminals 7 are connected by wire bonding (Step S27). Next, the semiconductor chips are sealed in the resin 8 (Step S28). If the interface of the semiconductor memory device 1b is set to SPI, the interface of the semiconductor memory device 1b is switched by the command SW in Step S26; in the case of the NAND interface, since there is no need to switch the interface and the initial setting can be used as it is, the processing is ended here.

3.4 Advantage of Third Embodiment

As is the case with the second embodiment, the semiconductor memory device 1b according to the present embodiment can arbitrarily select one of SPI and the NAND interface. Moreover, as is the case with the second embodiment, the semiconductor memory device 1b according to the present embodiment can prevent an increase in the circuit size, as compared to a case where a serial interface circuit and a NAND interface circuit are separately configured.

Furthermore, in the semiconductor memory device 1b according to the present embodiment, in at least some of the third terminals 602, the terminals to which the signals on SPI are input and the terminals to which the signals on the NAND interface are input are the same. As a result, an increase in the number of terminals for signal input caused as a result of two interfaces, SPI and the NAND interface, being provided can be prevented.

4 Modified Example

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the semiconductor memory devices according to the first to third embodiments include the ECC circuit 400, but the semiconductor memory devices according to the first to third embodiments may not include the ECC circuit 400.

Moreover, in the semiconductor memory device 1a according to the second embodiment, one of SPI and the NAND interface is selected by wire bonding and the setting data in the ROM 160a. In the semiconductor memory device 1b according to the third embodiment, one of SPI and the NAND interface is selected by a command from the host apparatus 5. However, various other selection methods are possible. For example, nonvolatile memory which is different from the ROM 160a may be prepared and setting data for selecting the interface may be stored in the nonvolatile memory. Moreover, the interface may be selected depending on whether a terminal on a semiconductor chip is connected to power-supply wiring, for example, by a connecting wire and a power-supply voltage is supplied to the terminal, or the terminal is not connected to the power-supply wiring and the power-supply voltage is not supplied to the terminal.

Furthermore, in the semiconductor memory device 1b according to the third embodiment, the multiplexer 603 is provided and, in at least some of the third terminals 602, the terminals to which the signals on SPI are input and the terminals to which the signals on the NAND interface are input are the same. However, as in the case of the second embodiment, the terminals to which the signals on SPI are input and the terminals to which the signals on the NAND interface are input may be independent of each other.

Figure 12:
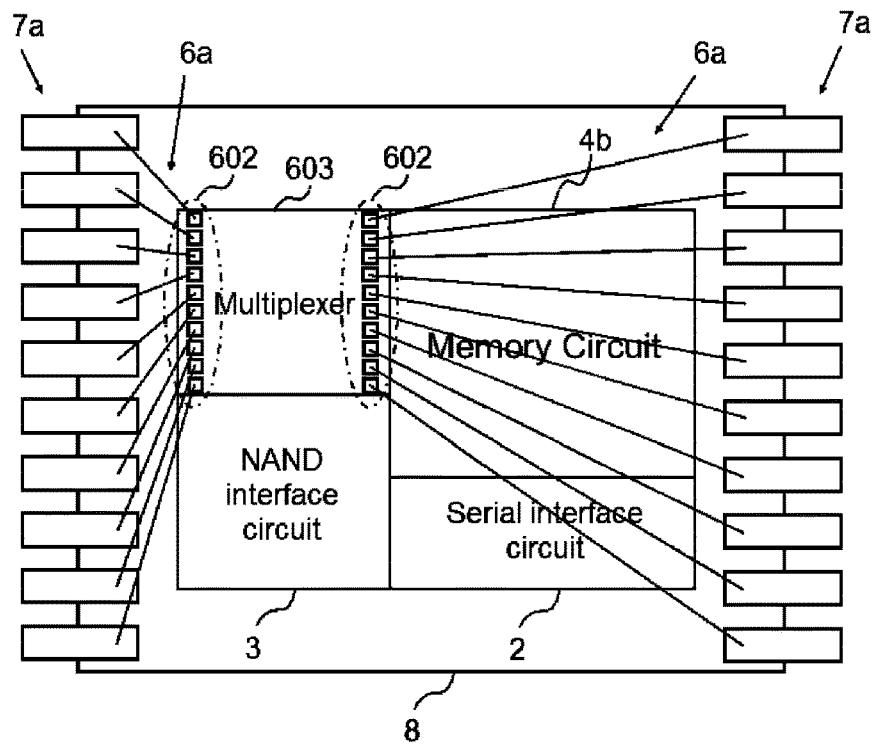
FIG. 12 illustrates a configuration of a package of a storage device according to a modified example of the third embodiment.

In addition, in the semiconductor memory device 1b according to the third embodiment, if, for example, SPI is selected as the interface of the semiconductor memory device 1b, as depicted in FIG. 10, the required number of external connecting terminals 7 for transferring the signals on SPI are provided and only the terminals of the third terminals 602 which transfer the signals on SPI are connected to the external connecting terminals 7. However, all the third terminals 602 may be connected to external connecting terminals of a package. FIG. 12 is a configuration diagram depicting a modified example of the package of the semiconductor memory device 1b according to the third embodiment. External connecting terminals 7a of the same number as the third terminals 602 are provided and all the third terminals 602 are connected to the external connecting terminals 7a via connecting wires 6a. By providing only the required number of external connecting terminals 7a for the selected interface in the package as in FIG. 10, an increase in the size of the semiconductor memory device caused by an increase in the number of external connecting terminals can be prevented. However, in the case of FIG. 10, after packaging, the user of the semiconductor memory device cannot change the interface of the semiconductor memory device. On the other hand, in the case of the modified example depicted in FIG. 12, since the terminals that transfer both the signals on SPI and the signals on the NAND interface are connected to the external connecting terminals 7a, even after packaging, the user of the semiconductor memory device can change the interface of the semiconductor memory device.

What is claimed is:

1. A storage device comprising:
   a nonvolatile semiconductor memory module; and
   a host interface for connection to a host that is external to the storage device, the host interface including a first interface circuit conforming to Serial Peripheral Interface (SPI) and a second interface circuit conforming to an interface standard different from SPI, wherein
   output terminals of the first interface circuit are connected to input terminals of the second interface circuit, and output terminals of the second interface circuit are connected to input terminals of the nonvolatile semiconductor memory module,
   the first interface circuit includes first, second, and third terminals, and is configured to transmit, from the first terminal, as a command, an initial portion of a signal received through the second terminal after a chip select signal is received through the third terminal, and
   the second interface circuit includes fourth, fifth, and sixth terminals, and is configured to transmit, from the fourth terminal, as a command, a portion of a signal received through the fifth terminal while a command latch enable signal received through the sixth terminal is asserted.

2. The storage device according to claim 1, wherein
   the nonvolatile semiconductor memory module and the host interface are formed on a substrate.

3. The storage device according to claim 1, wherein
   input terminals of the first interface circuit are directly connected to terminals of the storage device via wiring formed by wire bonding, and
   input terminals of the second interface circuit are connected to the terminals of the storage device through the first interface circuit.

4. The storage device according to claim 3, wherein
   when a command is received through the host, both of the first and second interface circuit operate.

5. The storage device according to claim 1, wherein
   input terminals of the second interface circuit are directly connected to terminals of the storage device via wiring formed by wire bonding, and
   input terminals of the first interface circuit are not connected to the terminals of the storage device.

6. The storage device according to claim 5, wherein
   when a command is received through the host, the second interface circuit operates, and the first interface circuit does not operate.

7. The storage device according to claim 1, further comprising:
   a switch circuit connected to terminals for connection to a host, and configured to transmit a command from the host to selected one of the first interface circuit and the second interface circuit.

8. The storage device according to claim 7, wherein
   the switch circuit is configured to switch between communication with the first interface circuit and communication with the second interface circuit, based on a command from the nonvolatile semiconductor memory module.

9. The storage device according to claim 7, wherein
   the nonvolatile semiconductor memory module, the switch circuit, and the host interface are formed on a substrate.

10. The storage device according to claim 7, wherein
    input terminals of the switch circuit are connected to terminals of the storage device via wiring formed by wire bonding, and
    output terminals of the switch circuit include terminals connected to input terminals of the first interface circuit and terminals connected to input terminals of the second interface circuit.

11. The storage device according to claim 1, wherein the first terminal is connected to the fifth terminal.

12. The storage device according to claim 1, wherein
    the second interface circuit conforms to an interface of a NAND flash memory.

13. A method for manufacturing a storage device, comprising:
    forming a nonvolatile semiconductor memory module; and
    forming a host interface for connection to a host that is external to the storage device, the host interface including a first interface circuit conforming to Serial Peripheral Interface (SPI) and a second interface circuit conforming to an interface standard different from SPI, wherein
       the first interface circuit includes first, second, and third terminals, and is configured to transmit, from the first terminal, as a command, an initial portion of a signal received through the second terminal after a chip select signal is received through the third terminal, and
       the second interface circuit includes fourth, fifth, and sixth terminals, and is configured to transmit, from the fourth terminal, as a command, a portion of a signal received through the fifth terminal while a command latch enable signal received through the sixth terminal is asserted; and
    connecting output terminals of the first interface circuit to input terminals of the second interface circuit;
    connecting output terminals of the second interface circuit to input terminals of the nonvolatile semiconductor memory module; and
    connecting directly selected one of (i) input terminals of the first interface circuit and (ii) input terminals of the second interface circuit, to terminals of the storage device for connection to the host, via wiring by wire bonding.

14. The method according to claim 13, wherein
    the nonvolatile semiconductor memory module and the host interface are formed on a substrate.

15. The method according to claim 13, wherein
    the input terminals of the first interface circuit are directly connected to the terminals of the storage device via the wiring.

16. The method according to claim 13, wherein
    the input terminals of the second interface circuit are directly connected to the terminals of the storage device via the wiring.

17. The method according to claim 13, wherein
    the second interface circuit conforms to an interface of a NAND flash memory.

18. The method according to claim 13, further comprising:
    storing setting data conforming to the first interface circuit in a storage of the nonvolatile semiconductor memory module, when the first interface circuit is selected; and
    storing setting data conforming to the second interface circuit in the storage of the nonvolatile semiconductor memory module, when the second interface circuit is selected.

* * * * *